(12) United States Patent
Ma et al.

(10) Patent No.: US 9,929,702 B2
(45) Date of Patent: Mar. 27, 2018

(54) LINEARIZATION CIRCUIT FOR A MULTIPLE-STAGE RF POWER AMPLIFIER

(71) Applicant: Qorvo US, Inc., Greensboro, NC (US)

(72) Inventors: Wenlong Ma, Fremont, CA (US); Barry Jia-Fu Lin, Cupertino, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/265,173

(22) Filed: Sep. 14, 2016

(65) Prior Publication Data

US 2017/0077879 A1   Mar. 16, 2017

Related U.S. Application Data

(60) Provisional application No. 62/218,068, filed on Sep. 14, 2015.

(51) Int. Cl.
  H03F 1/32  (2006.01)
  H03F 3/21  (2006.01)
  H03F 3/191 (2006.01)

(52) U.S. Cl.
  CPC ......... *H03F 1/3241* (2013.01); *H03F 1/3282* (2013.01); *H03F 3/191* (2013.01);
  (Continued)

(58) Field of Classification Search
  CPC ................................................ H03F 1/3241
  See application file for complete search history.

(56) References Cited

U.S. PATENT DOCUMENTS 2,907,960 A * 10/1959 Avins .................. H03H 7/0169
  333/176
3,213,387 A * 10/1965 Snijders .................... H03F 1/33
  330/109

(Continued)

OTHER PUBLICATIONS

Cho, Yungsung et al., "Low Idle Current LTE Power Amplifier With 2nd Harmonic Control," Proceedings of the 7th European Microwave Integrated Circuits Conference, Oct. 29-30, 2012, Amsterdam, The Netherlands, pp. 337-340.
Franco, Marc J., "Bias induced memory effects in RF power amplifiers," PowerPoint presentation, Linearizer Technology Inc., Hamilton, NJ, Oct. 9, 2006, 38 pages.

(Continued)

*Primary Examiner* — Patricia T Nguyen
(74) *Attorney, Agent, or Firm* — Withrow & Terranova, P.L.L.C.

(57) ABSTRACT

A multi-stage Radio Frequency (RF) power amplifier is presented herein. According to one embodiment, the amplifier comprises: a first amplification stage configured to amplify an input signal to provide a first output signal having a phase distortion; a second amplification stage having an input and configured to amplify the first output signal that is received at the input to provide a second output signal, wherein the second output signal has a carrier frequency ($F_C$) modulated by a signal content (S) having a signal content bandwidth ($F_S$); and a resonant circuit comprising an inductor and a capacitor and having a resonant frequency ($F_R$), the resonant circuit coupled to the input of the second amplification stage and compensating for the phase distortion caused by the first amplification stage at frequencies within the signal content bandwidth $F_S$, wherein the resonant frequency $F_R$ is less than the signal content bandwidth $F_S$.

15 Claims, 22 Drawing Sheets

(52) U.S. Cl.
CPC ......... *H03F 3/21* (2013.01); *H03F 2200/225* (2013.01); *H03F 2200/411* (2013.01); *H03F 2200/451* (2013.01); *H03F 2200/541* (2013.01); *H03F 2200/552* (2013.01); *H03F 2200/555* (2013.01); *H03F 2201/3209* (2013.01)

(56) References Cited

U.S. PATENT DOCUMENTS

| | | | | |
|---|---|---|---|---|
| 3,304,377 | A * | 2/1967 | Kietz | G11B 15/14 360/26 |
| 4,194,154 | A * | 3/1980 | Kahn | H04B 1/04 381/16 |
| 5,598,302 | A * | 1/1997 | Park | G11B 20/10009 360/46 |
| 6,529,080 | B1 | 3/2003 | Seymour et al. | |
| 8,611,459 | B2 | 12/2013 | McCallister | |
| 2010/0141340 | A1* | 6/2010 | Huang | H03F 3/45197 330/253 |

OTHER PUBLICATIONS

Kim, Bumman et al., "Advanced Design of Differential CMOS PA," 2014 IEEE Topical Conference on Power Amplifiers for Wireless and Radio Applications (PAWR), Jan. 2014, IEEE, pp. 31-33.

Kimura, Koichi et al., "Improvement in ACLR Asymmetry for W-CDMA InGaP/GaAs HBT Power Amplifier," 12th GAAS Symposium, Amdsterdam, 2004, pp. 527-530.

Jin, Sangsu et al., "Control of IMD Asymmetry of CMOS Power Amplifier for Broadband Operation Using Wideband Signal," IEEE Transactions on Microwave Theory and Techniques, vol. 61, No. 10, Oct. 2013, pp. 3753-3762.

Park, Byungjoon et al., "A 31.5%, 26 dBm LTE CMOS Power Amplifier with Harmonic Control," Proceedings of the 7th European Microwave Integrated Circuits Conference, Oct. 29-30, 2012, Amsterdam, The Netherlands, pp. 341-344.

Takenaka, Isao et al., "Improvement of Intermodulation Distortion Asymmetry Characteristics With Wideband Microwave Signals in High Power Amplifiers," IEEE Transactions on Microwave Theory and Techniques, vol. 56, No. 6, Jun. 2008, pp. 1355-1363.

* cited by examiner

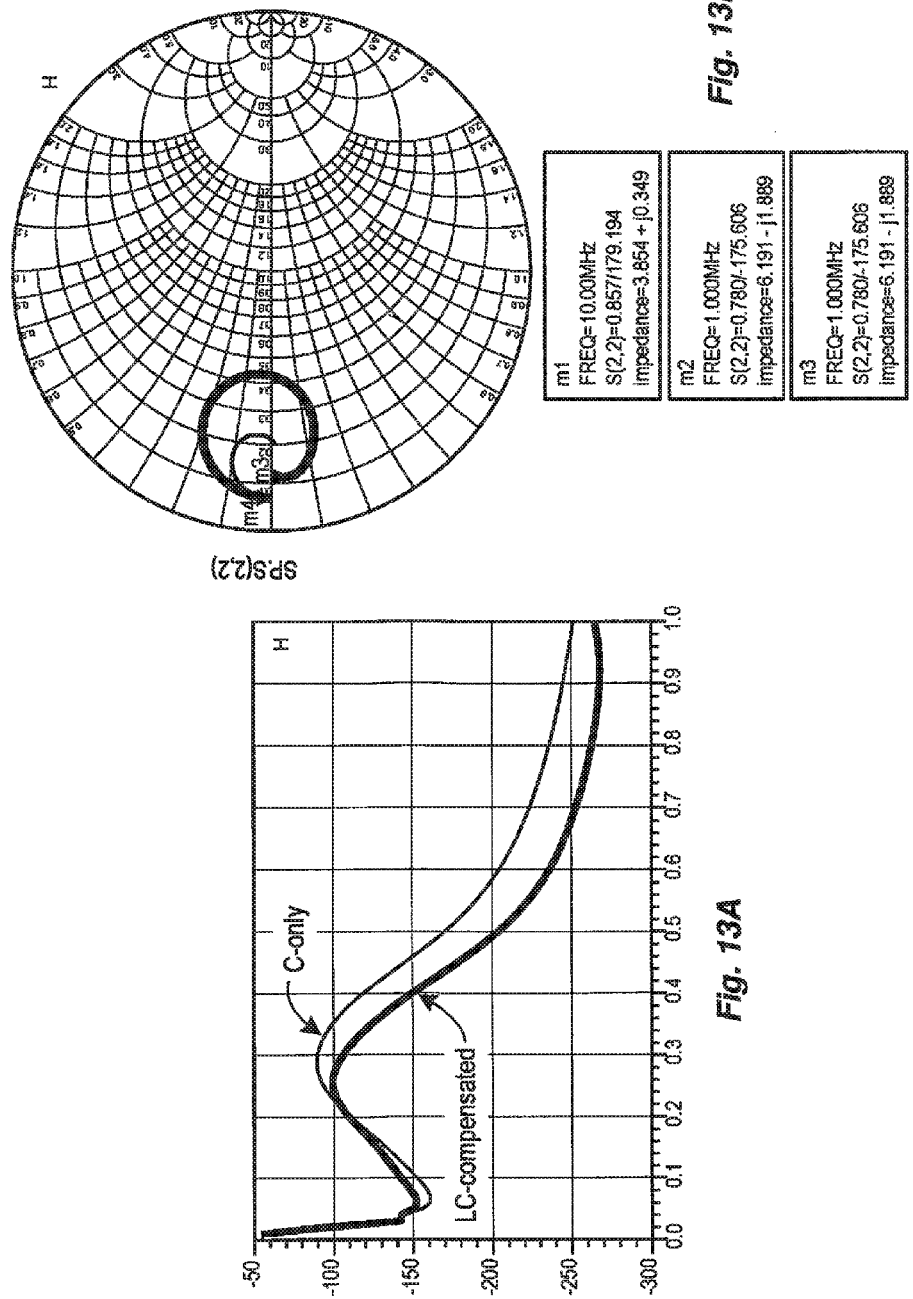

LINEARIZATION CIRCUIT FOR A MULTIPLE-STAGE RF POWER AMPLIFIER

RELATED APPLICATIONS

This application claims the benefit of provisional patent application Ser. No. 62/218,068, filed Sep. 14, 2015, the disclosure of which is hereby incorporated herein by reference in its entirety.

FIELD OF THE DISCLOSURE

The present disclosure relates to a linearization circuit for a multiple-stage Radio Frequency (RF) power amplifier.

BACKGROUND

Linearization of a Radio Frequency (RF) amplifier is an important design technique to achieve a high linearity of an RF amplifier. The term "linearity" refers to the ability of the amplifier to produce signals that are accurate copies of the input but at increased power levels. In an ideal RF amplifier, the transfer function that describes the relationship of input power to output power is linear. In actual RF amplifiers, the transfer function is a non-linear function. Typically, as the input power increases, the amplifier has more and more difficulty maintaining the same level of amplification, i.e., the gain begins to drop. When the output of the amplifier differs from the input, this difference introduces distortion into the output. For example, when the output of an amplifier is clipped, this introduces high-frequency components into the output signal that were not present in the input signal. Thus, in real (not simulated or ideal) RF power amplifiers, the gain is a non-linear function that varies with input signal level. However, in real RF power amplifiers, the gain varies due to "memory effects," which cause the gain to vary not only with input signal level, but also as a function of other parameters such as frequency, temperature, etc.

There are several conventional approaches to improving linearity of an RF amplifier. In one approach, a diode is used to introduce predistortion compensation so that the predistortion produced by the diode and the distortion produced by the RF amplifier cancel each other out. Another approach is to use a second harmonic short circuit and/or video band short circuit (i.e., a capacitor) to reduce the second harmonic impedance and reduce the memory effect [1, 2, 3, 4, 5, 6], where "video band" refers to the frequency range between 0 and 100 MHz. Yet another technique is to use an impedance tuner at the RF frequency domain to improve the linearity [7]. This technique involves manipulation of the signal at the carrier (e.g., RF) frequency rather than at the data (e.g., video) frequency.

SUMMARY

The present disclosure relates to the use of a video band phase and/or an amplitude adjustment network, such as a simple inductor-capacitor (LC) tank circuit, to compensate the distortion from the previous stage in a multiple-stage (multi-stage) amplifier circuit. The method of the present disclosure has demonstrated its effectiveness in memory effect suppression and in distortion suppression to enhance the linearity of the Radio Frequency (RF) amplifier in simulation and in a real circuit implementation. Linearity has improved by 5-10 dBc in Adjacent Channel Leakage Ratio (ACLR) while maintaining a high efficiency in a deep class AB amplifier in designs.

According to one aspect, a multi-stage RF power amplifier comprises a first amplification stage configured to amplify an input signal to provide a first output signal having a phase distortion; a second amplification stage having an input and configured to amplify the first output signal that is received at the input to provide a second output signal, wherein the second output signal has a carrier frequency ($F_C$) modulated by a signal content (S) having a signal content bandwidth ($F_S$); and a resonant circuit comprising an inductor and a capacitor and having a resonant frequency ($F_R$), the resonant circuit coupled to the input of the second amplification stage and compensating for the phase distortion caused by the first amplification stage at frequencies within the signal content bandwidth $F_S$, wherein the resonant frequency $F_R$ is less than the signal content bandwidth $F_S$.

In one embodiment, the carrier frequency $F_C$ is greater than 1.0 GHz. In one embodiment, the carrier frequency $F_C$ is in a range from 2.0 GHz to 2.2 GHz.

In one embodiment, the signal content bandwidth $F_S$ is less than 50 MHz. In one embodiment, the signal content bandwidth $F_S$ is in a range from 18 MHz to 22 MHz.

In one embodiment, the resonant frequency $F_R$ is less than 15 MHz. In one embodiment, the resonant frequency $F_R$ is in a range from 1 MHz to 10 MHz. In one embodiment, the resonant frequency $F_R$ is in a range from 2 MHz to 5 MHz.

In one embodiment, the signal content bandwidth $F_S$ is less than 50 MHz and the resonant frequency $F_R$ is less than 10 MHz. In one embodiment, the signal content bandwidth $F_S$ is less than 25 MHz and the resonant frequency $F_R$ is less than 7 MHz. In one embodiment, the resonant frequency $F_R$ is in a range from ($F_S/4$) to ($F_S/2$).

In one embodiment, the inductor and capacitor are configured as an LC tank network. In one embodiment, the inductor and capacitor are connected in series. In one embodiment, the inductor and capacitor are connected in parallel. In one embodiment, the inductor has a nominal inductance of 3.9 nanoHenries (nH) and wherein the capacitor has a nominal capacitance of 0.22 microFarads (µF).

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 13A is a graph of phase versus frequency from 1 MHz to 1 GHz, comparing a conventional C-only compensated circuit (thin line) to the LC-compensated circuit in FIG. 10 (thick line).

FIG. 13B is a Smith plot of output impedance S(2,2) for a frequency from 1 MHz to 1 GHz, comparing a conventional C-only compensated circuit (thin line) to the LC-compensated circuit in FIG. 10 (thick line).

DETAILED DESCRIPTION

Figure 1:
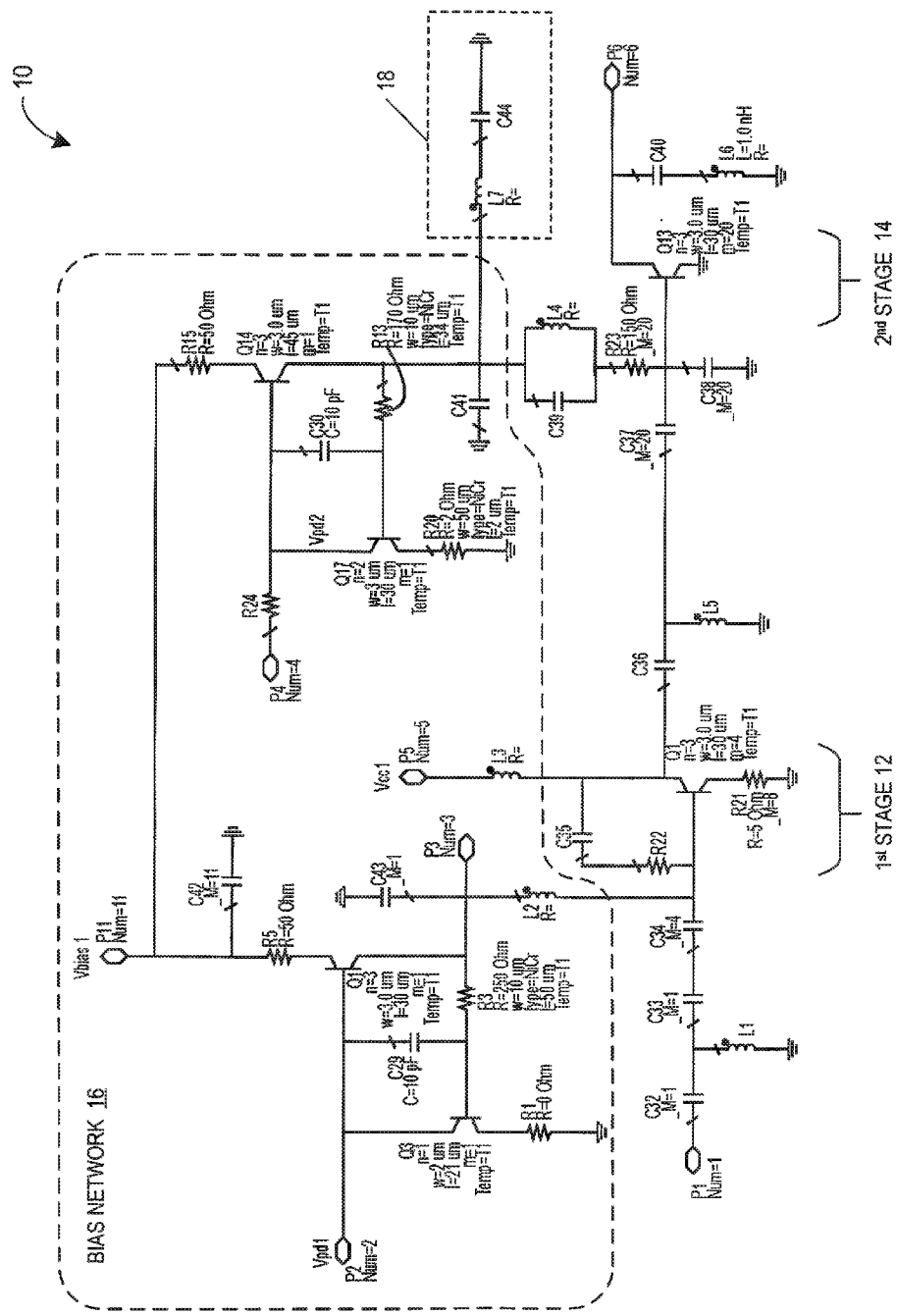
FIG. 1 is a schematic diagram of an exemplary multiple-stage (multi-stage) Radio Frequency (RF) power amplifier with linearization circuit according to an embodiment of the subject matter described herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

As used herein, the term "nominal" as applied to a stated value means the de facto or expected value, in recognition of the fact that the actual, measured value may be different. For example, a capacitor with a nominal value of 0.47 microfarads (μF) is manufactured with the intent to have that exact capacitance but which, due to manufacturing tolerances, may have an actual value that is above or below the nominal value by some accepted range of error, e.g., between 0.465 and 0.475 μF, within some percentage above and below the nominal value, and so on.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic diagram of an exemplary multiple-stage (multi-stage) Radio Frequency (RF) power amplifier 10 with a linearization circuit according to an embodiment of the subject matter described herein. In the embodiment illustrated in FIG. 1, amplifier 10 comprises a first amplification stage 12 and a second amplification stage 14. The first amplification stage 12 may be referred to herein as "first stage 12" or "first amplifier 12." The second amplification stage 14 may be referred to herein as "second stage 14" or "second amplifier 14." In the embodiment illustrated in FIG. 1, a bias network 16 properly biases the first stage 12 and second stage 14.

The first stage 12 is configured to amplify an input signal received at port P1 to provide a first output signal having a phase distortion. The second stage 14 has an input and is configured to amplify the first output signal from the first stage 12 to provide a second output signal at port P6. The second output signal has a carrier frequency ($F_C$) modulated by a signal content (S) having a signal content bandwidth ($F_S$). In one embodiment, the output signal is a Long-Term Evolution (LTE) signal having a carrier frequency $F_C$ of 2.1 GHz and a signal content bandwidth $F_C$ of 20 MHz.

A resonant circuit 18 is connected to the input of the second stage 14 and operates as a compensation network. In the embodiment illustrated in FIG. 1, the resonant circuit 18 comprises an inductor L7 and a capacitor C44 and has a resonant frequency ($F_R$). In one embodiment, the inductor and capacitor form an inductor-capacitor (LC) tank circuit. The resonant circuit 18 compensates for a phase distortion caused by the first amplification stage 12 at frequencies within the signal content bandwidth $F_S$. The resonant frequency $F_R$ is less than the signal content bandwidth F. In this manner, the compensation network has a phase-versus-frequency characteristic that is tuned to provide compensation in a data frequency (e.g., in the megahertz range) rather than in a carrier frequency (e.g., in the gigahertz range). As will be shown in figures below, the resonant circuit 18 in the embodiment illustrated in FIG. 1 provides significant phase compensation below 500 MHz but none (or almost none) above 1.5 GHz.

Thus, in contrast to conventional methods that attempt to suppress intermodulation distortion by applying notch filters just above and below the carrier frequency, the resonant circuit 18 provides compensation in the video band.

The method of the present disclosure uses a phase and amplitude adjuster network, such as the resonant circuit 18 attached to the input of the last stage amplifier in a multi-stage RF amplifier circuit such as the circuit illustrated in FIG. 1. The slope of the phase of this network can be tuned or adjusted to compensate the phase/amplitude of the previous stage in the video band frequency so that the memory effect can be minimized. This acts like a predistortion circuit in the video band to minimize the memory effect such that the overall Adjacent Channel Power Ratio (ACPR) of the multi-stage RF amplifier can be much improved.

In one embodiment, the carrier frequency $F_C$ is greater than 1.0 GHz. In one embodiment, the carrier frequency $F_C$ is in a range from 2.0 GHz to 2.2 GHz. In LTE applications, for example, carrier frequencies used include 2.10 GHz, 2.14 GHz, and 2.17 GHz.

In one embodiment, the signal content bandwidth $F_S$ is less than 50 MHz. In one embodiment, the signal content bandwidth is in a range from 18 MHz to 22 MHz. In LTE applications, for example, signal content bandwidth $F_S$ may be 20 MHz.

In one embodiment, the resonant circuit 18 has a resonant frequency $F_R$ of less than 15 MHz. In one embodiment, the resonant frequency $F_R$ is in a range from 1 MHz to 10 MHz. In one embodiment, the resonant frequency $F_R$ is in a range from 2 MHz to 5 MHz. In one embodiment, described in more detail below, the resonant frequency $F_R$ is not tuned to the $F_S$ but is instead off-tuned to a value below $F_S$ so that the slope of the phase-versus-frequency characteristic of the resonant circuit 18 cancels the phase distortion caused by the previous amplification stage.

For example, in one embodiment, $F_S$ is less than 50 MHz and $F_R$ is less than 10 MHz. In another embodiment, $F_S$ is less than 25 MHz and $F_R$ is less than 7 MHz. In an LTE application, for example, $F_S$ may be 20 MHz and $F_R$ may be tuned to 5 MHz. In yet another embodiment, the resonant frequency $F_R$ may be specified as a percentage or fraction of $F_S$. For example, $F_R$ may be set to be a value between $F_S/4$ and $F_S/2$, etc.

In one embodiment, the inductor and capacitor of the resonant circuit 18 are configured as an LC tank network. In one embodiment, the inductor and capacitor are connected in series. In another embodiment, the inductor and capacitor are connected in parallel. In an LTE application, for example, the resonant circuit 18 may have a 3.9 nanoHenries (nH) inductor and a 0.22 μF capacitor connected in series between the input of the second stage 14 and system ground.

The present disclosure differs from the related art in at least to respects: first, the phase/amplitude adjusters are in the video band; and second, the embodiment works in a multi-stage amplifier, not a single-stage amplifier.

Figure 2:
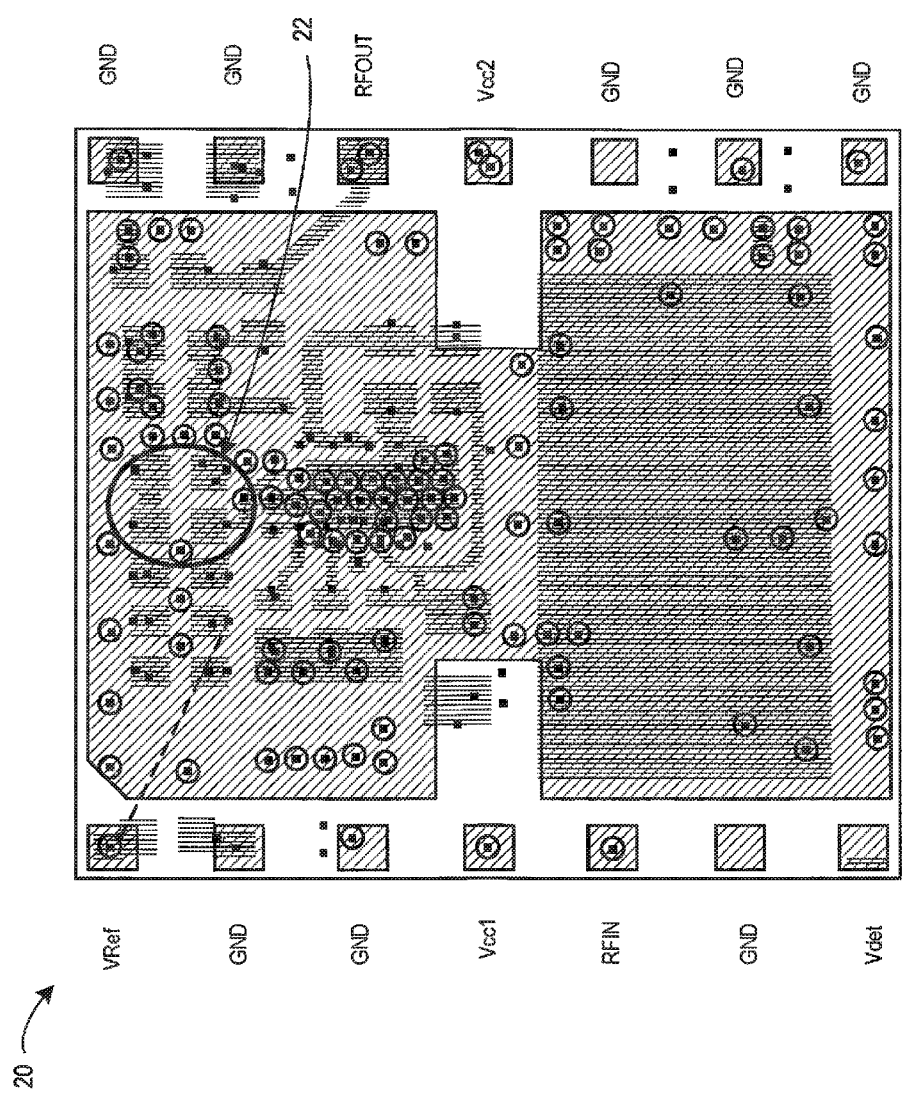
FIG. 2 is a simplified chip plot of an exemplary multi-stage RF power amplifier with linearization circuit according to an embodiment of the subject matter described herein.

FIG. 2 is a simplified chip plot of an exemplary multi-stage RF power amplifier with linearization circuit according to an embodiment of the subject matter described herein. FIG. 2 shows an example embodiment in a new RF amplifier module product's laminate layout 20, showing the location of an LC resonant circuit 22. The design shown improved ACLR tested with a 20 MHz LTE signal by 5-8 dB.

Figure 3:
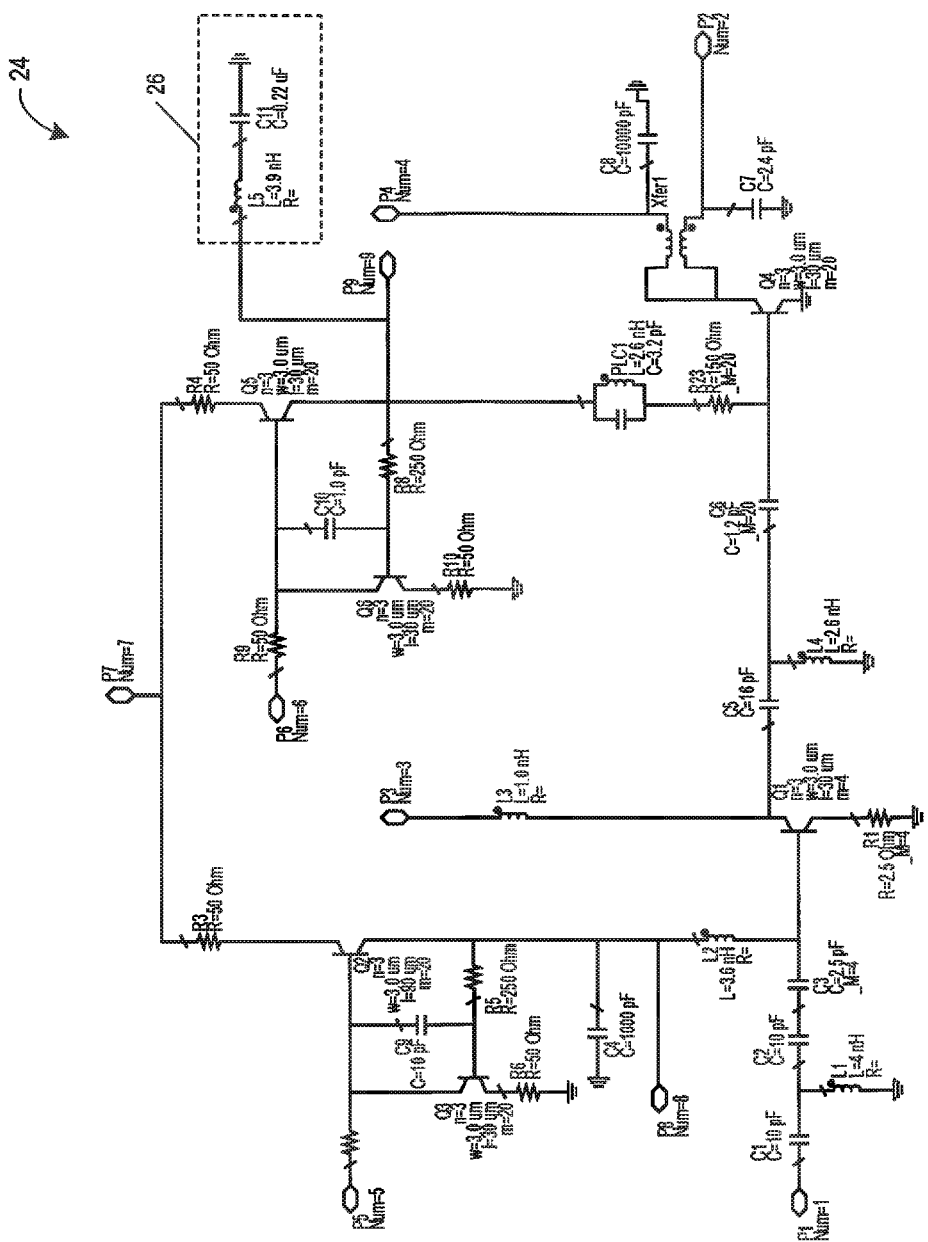
FIG. 3 is a schematic diagram of an exemplary multi-stage RF power amplifier with linearization circuit according to another embodiment of the subject matter described herein.

FIG. 3 is a schematic diagram of an exemplary multi-stage RF power amplifier 24 with linearization circuit according to another embodiment of the subject matter described herein. FIG. 3 shows the schematics of a die and a LC tank network 26 with L=3.9 nH and C=0.22 µF on the laminate to illustrate the embodied network. A comparison the performance of this circuit versus an uncompensated circuit and a conventionally compensated circuit is shown in FIG. 4 and in FIG. 5.

Figure 4:
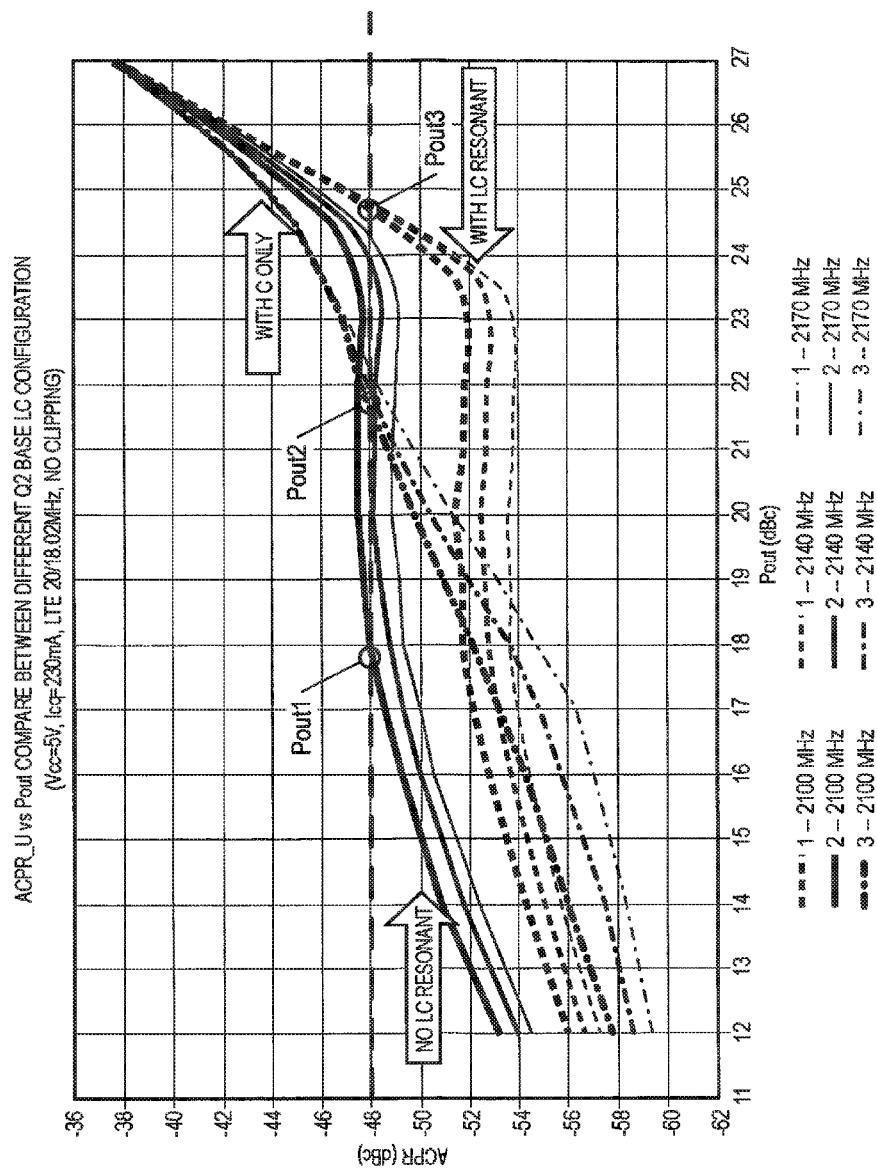
FIG. 4 is a graph of Adjacent Channel Power Ratio (ACPR) versus output power, showing an improvement of performance of an exemplary circuit according to an embodiment of the subject matter described herein (simple dashed lines) as compared to an uncompensated circuit (solid lines) and conventional, C-only compensated circuits (complex dashed lines).

FIG. 4 is a graph of ACPR versus output power (both measured in dBc), showing an improvement of performance of an exemplary circuit according to an embodiment of the subject matter described herein (simple dashed lines) as compared to an uncompensated circuit (solid lines) and conventional, C-only compensated circuits (complex dashed lines). FIG. 4 shows an improvement of the measured Adjacent Channel Leakage Ratio (ACLR) data with a 20 MHz LTE signal. In FIG. 4, the dashed horizontal line at −48 dBc ACPR represents an upper limit of ACPR allowed by the LTE specification. In each of the three circuits—without compensation, with conventional C-only compensation, and with the LC resonant circuit of the subject matter described herein—it can be seen that the adjacent channel leakage increases as output power increases.

However, there is a significant difference in performance between the three circuits. The uncompensated circuit can produce about 18.7 dBm of output power before its ACPR exceeds the −48 dBc limit. This is indicated by the point labeled Pout1. Conventionally compensated circuits (C-only) can produce about 21.6 dBm of output power before ACPR exceeds the −48 dBc limit, as shown by the point labeled Pout2. Power amplifiers according to embodiments of the subject matter described herein can produce about 24.8 dBm of output power before ACPR exceeds the limit, as shown by the point labeled Pout3. This is an improvement of 3.2 dBc over conventionally compensated circuits and an improvement of 6.1 dBc over uncompensated circuits.

Figure 5:
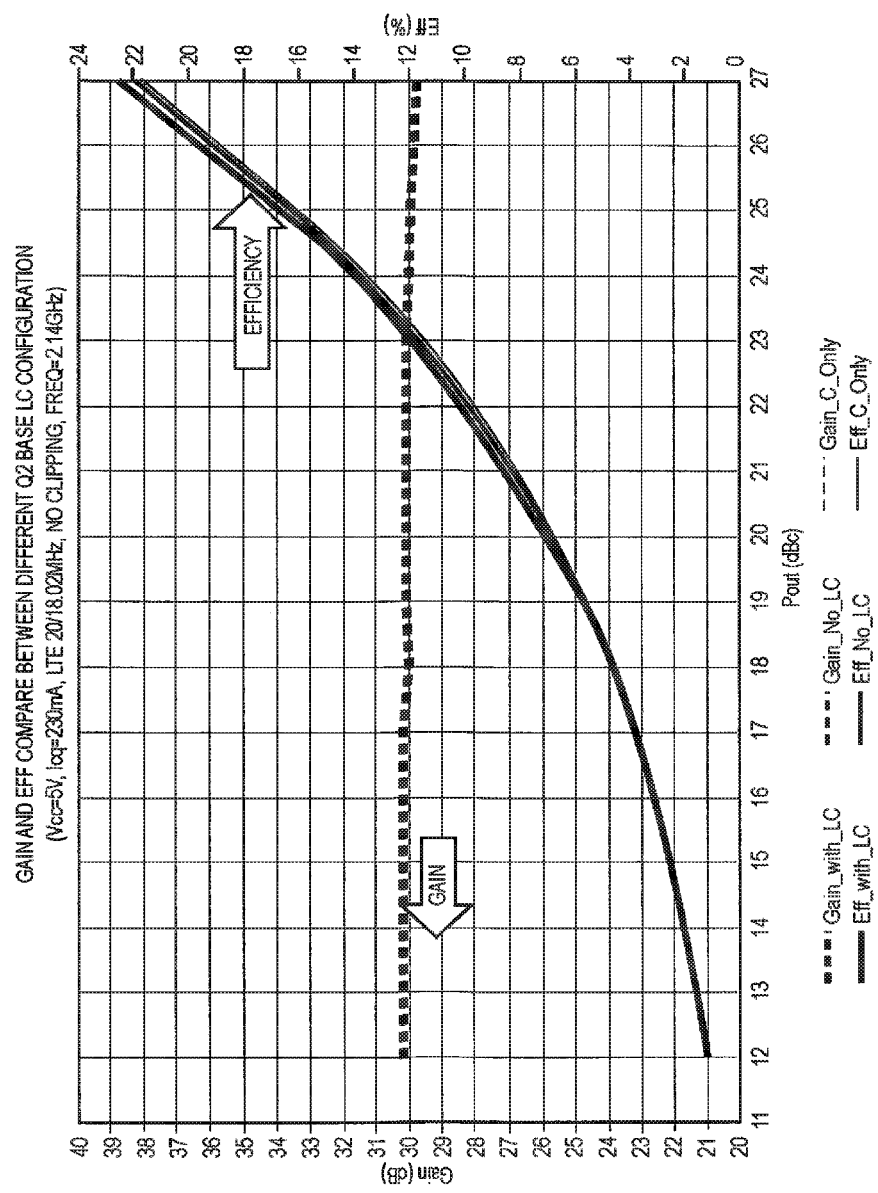
FIG. 5 is a graph of gain and efficiency versus output power, showing an improvement of performance of an exemplary circuit according to an embodiment of the subject matter described herein (thick lines) as compared to an uncompensated circuit (medium lines) and conventional, C-only compensated circuits (thin lines).

FIG. 5 is a graph of gain and efficiency versus output power, showing an improvement of performance of an exemplary circuit according to an embodiment of the subject matter described herein (thick lines) as compared to an uncompensated circuit (medium lines) and conventional, C-only compensated circuits (thin lines). It can be seen from FIG. 5 that there is very little effect on gain or efficiency by the present embodiment observed in the measured data. This big improvement of LTE ACLR can be understood by a third-order intermodulation distortion (IMD3) simulation with and without the embodied circuit.

Figure 6A:
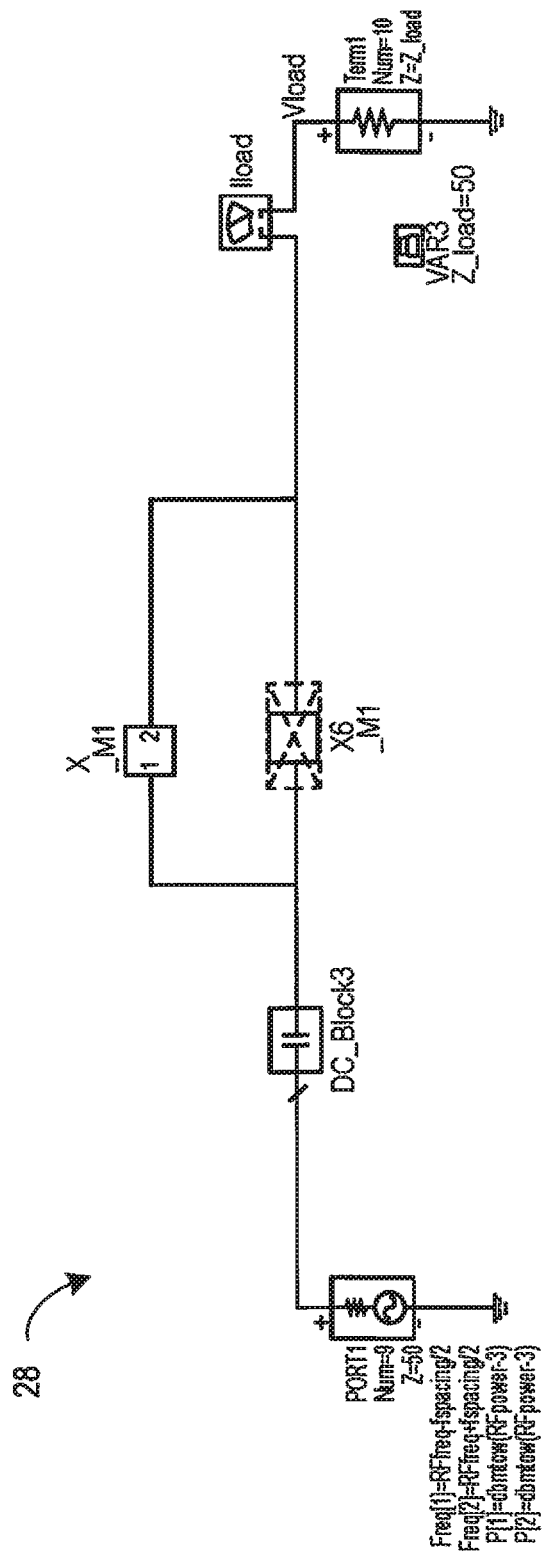
FIG. 6A is a schematic diagram of a circuit used for a Third-Order Intermodulation Distortion (IMD3) simulation.
Figure 6B:
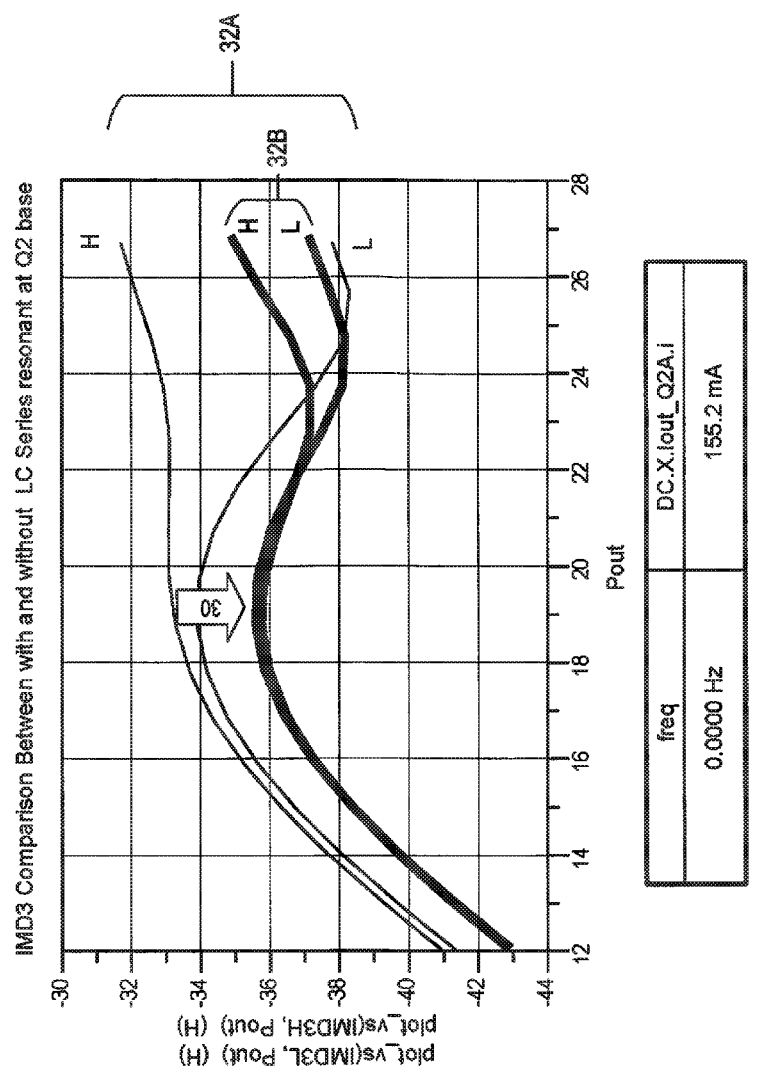
FIG. 6B is a graph of IMD3 versus output power, showing an improvement of performance of an exemplary circuit according to an embodiment of the subject matter described herein (thick lines) as compared to an uncompensated circuit (thin lines).

FIG. 6A is a schematic diagram of a circuit 28 used for an IMD3 simulation. FIG. 6B is a graph of IMD3 versus output power, showing an improvement of performance of an exemplary circuit 28 according to an embodiment of the subject matter described herein (thick lines) as compared to an uncompensated circuit (thin lines). It can be seen in FIG. 6B that the LC-compensated circuit 28 demonstrates a clear improvement of both IMD3 (arrow 30) and imbalance between IMD3H and IMD3L compared to the uncompensated circuit (difference 32A versus difference 32B).

Figure 7A:
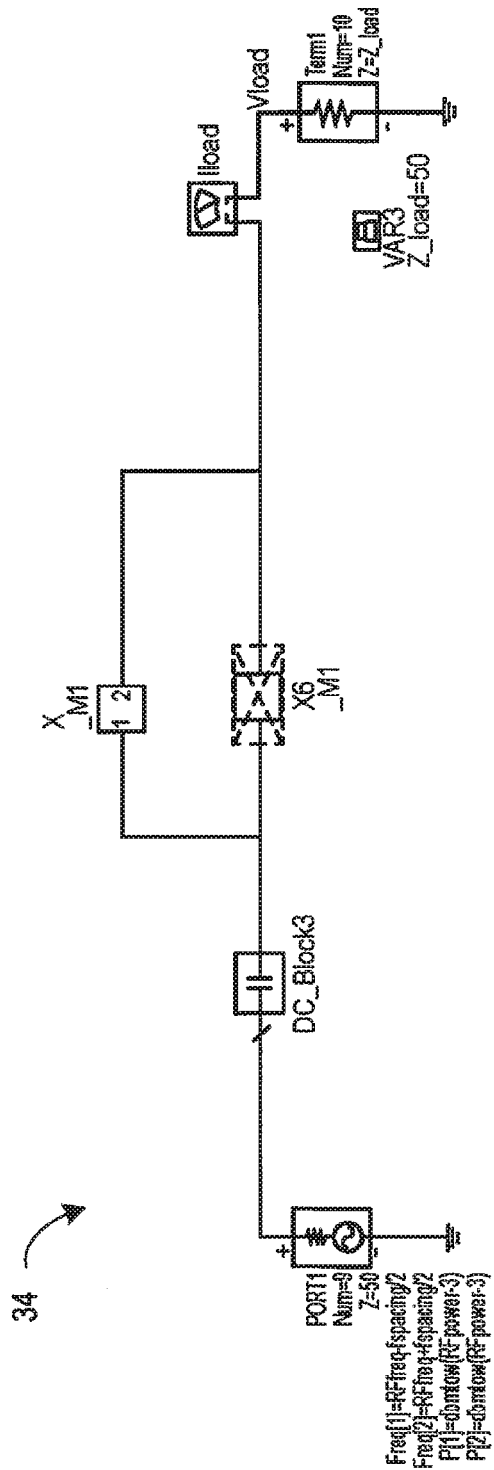
FIG. 7A is a schematic diagram of a circuit used for another IMD3 simulation.
Figure 7B:
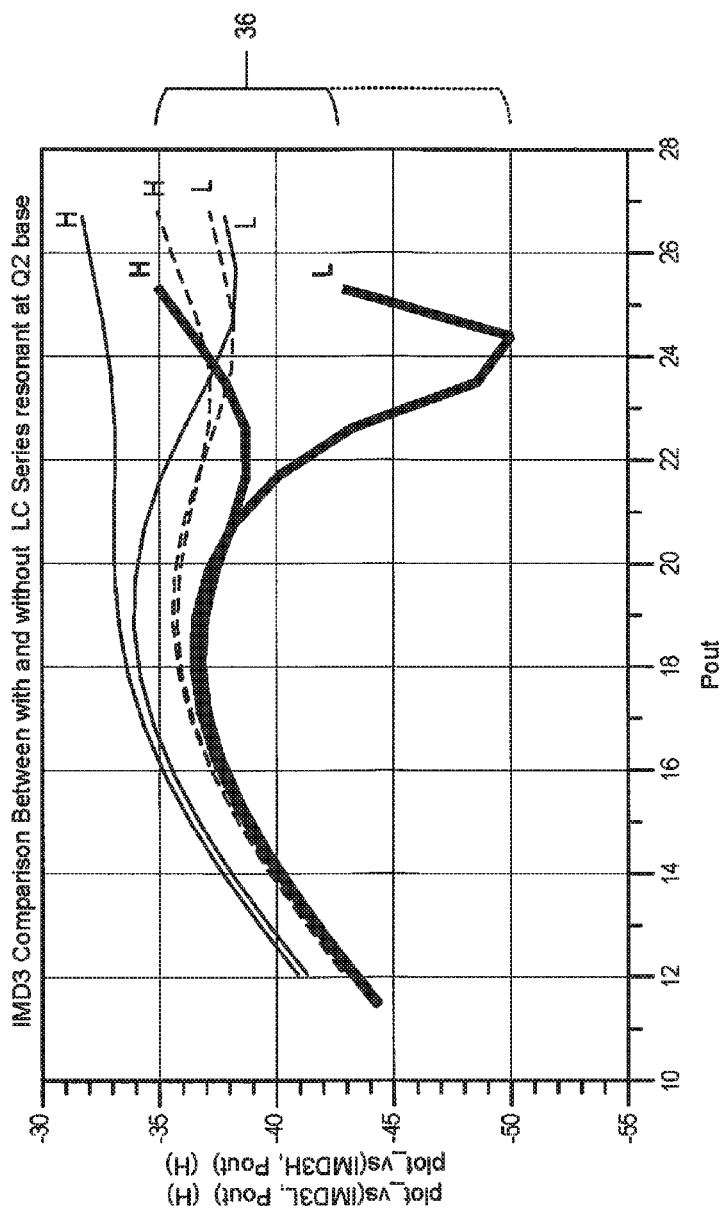
FIG. 7B is a graph of IMD3 versus output power, showing an improvement of performance of an exemplary circuit according to an embodiment of the subject matter described herein (dashed lines) as compared to an uncompensated circuit (thin lines) and conventional, C-only compensated circuits (thick lines).

FIG. 7A is a schematic diagram of a circuit 34 used for another IMD3 simulation. FIG. 7B is a graph of IMD3 versus output power, showing an improvement of performance of an exemplary circuit 34 according to an embodiment of the subject matter described herein (dashed lines) as compared to an uncompensated circuit (thin lines) and conventional, C-only compensated circuits (thick lines). It can be seen in FIG. 7B that the C-only circuit shows a big imbalance of IMD3 at high output power range (difference 36) compared to the LC-compensated circuit, which shows the smallest imbalance at high output power.

Figure 8A:
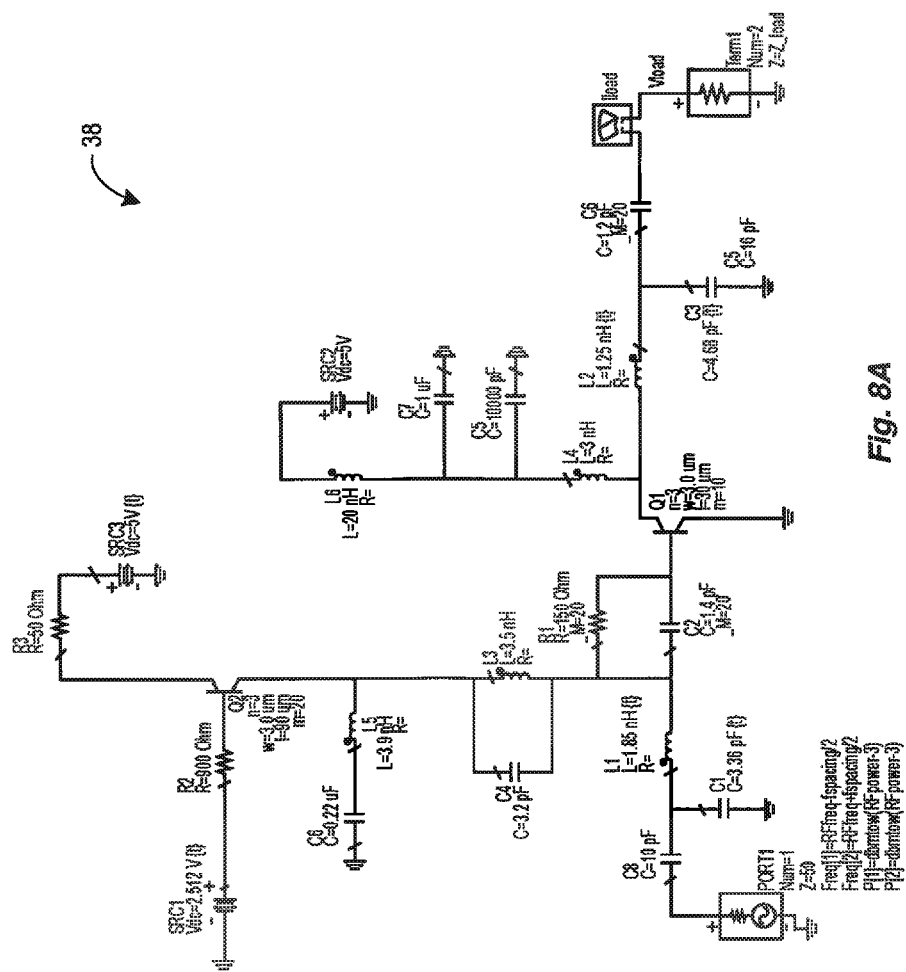
FIG. 8A is a schematic diagram of single stage RF power amplifier with linearization circuit according to another embodiment of the subject matter described herein.
Figure 8B:
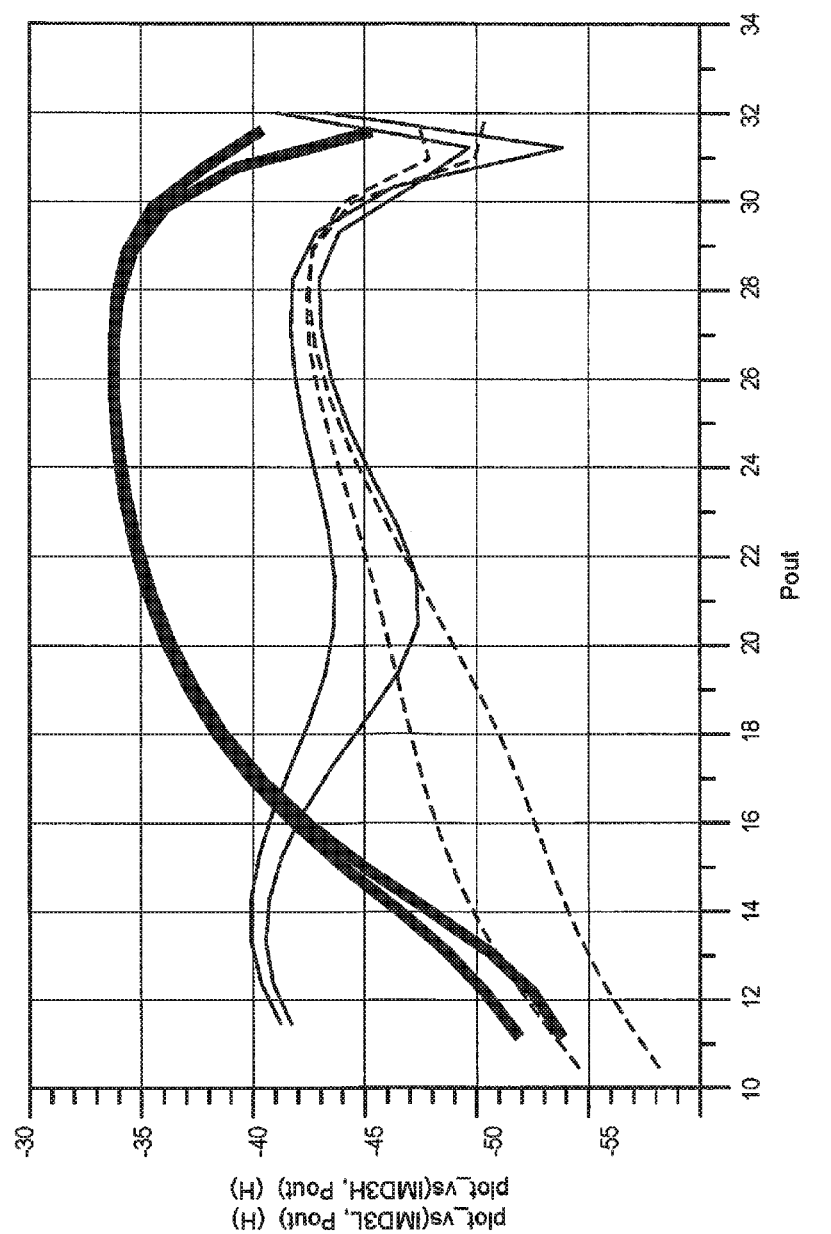
FIG. 8B is a graph of IMD3 versus output power for an exemplary circuit according to an embodiment of the subject matter described herein (dashed lines), an uncompensated circuit (thin lines) and a conventional, C-only compensated circuit (thick lines), showing that the improvement of performance seen in a multi-stage RF amplifier is not seen in a single stage amplifier.

FIG. 8A is a schematic diagram of single stage RF power amplifier 38 with linearization circuit according to another embodiment of the subject matter described herein. FIG. 8B is a graph of IMD3 versus output power for an exemplary circuit 38 according to an embodiment of the subject matter described herein (dashed lines), an uncompensated circuit (thin lines) and a conventional, C-only compensated circuit (thick lines), showing that the improvement of performance seen in a multi-stage RF amplifier is not seen in a single stage amplifier.

Figure 9A:
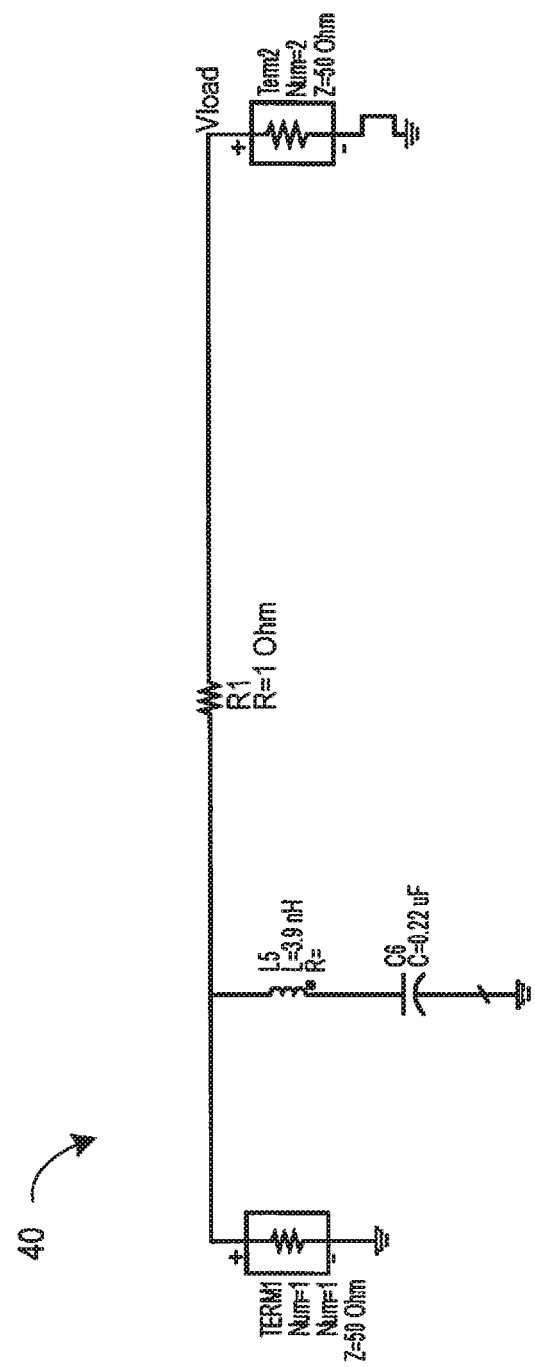
FIG. 9A is a schematic diagram of an exemplary linearization circuit according to an embodiment of the subject matter described herein.
Figures 9B, 9C:
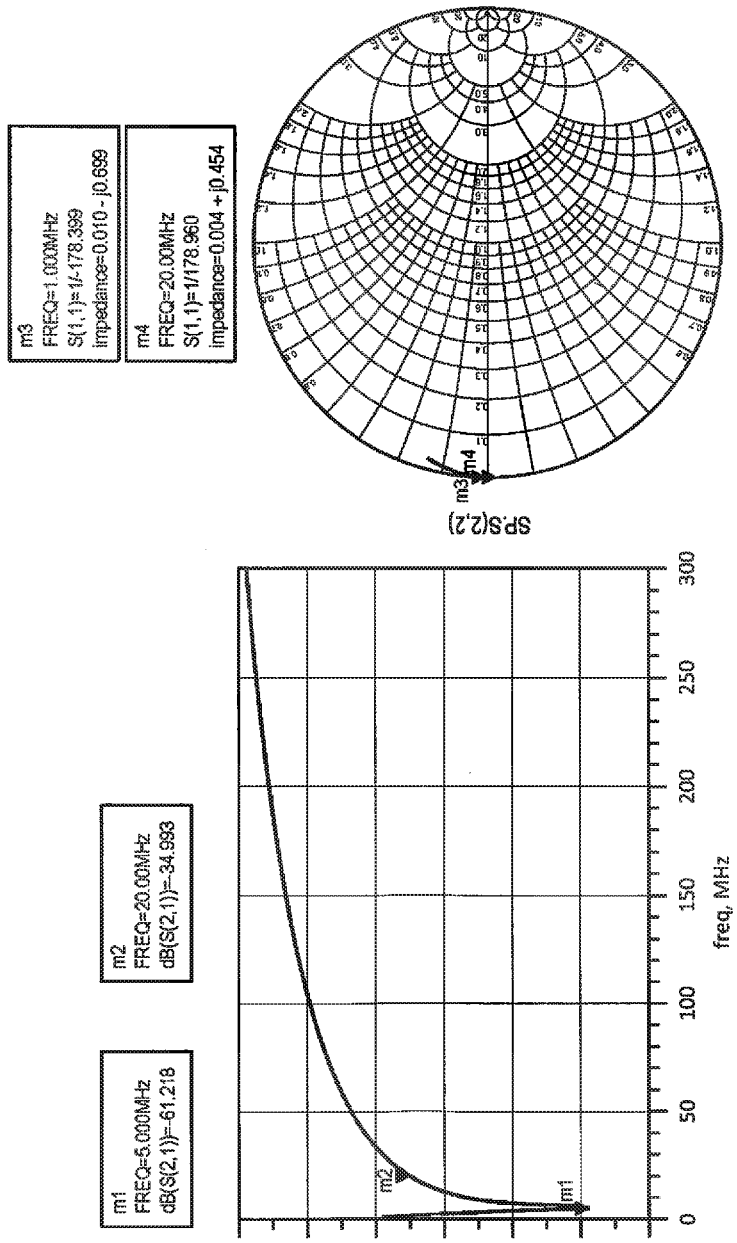
FIG. 9B is a plot of gain versus frequency for the exemplary linearization circuit of FIG. 9A for a frequency from 0 MHz to 300 MHz.
FIG. 9C is a Smith plot of input impedance S(1,1) for the exemplary linearization circuit of FIG. 9A for a frequency from 0 MHz to 300 MHz.

FIG. 9A is a schematic diagram of an exemplary linearization circuit 40 according to an embodiment of the subject matter described herein. FIG. 9B is a plot of gain versus frequency for the exemplary linearization circuit of FIG. 9A for a frequency from 0 MHz to 300 MHz. FIG. 9C is a Smith plot of input impedance S(1,1) for the exemplary linearization circuit of FIG. 9A for a frequency from 0 MHz to 300 MHz. Thus, this IMD3 improvement of the LC tank circuit can be understood with the following explanation. FIG. 9B shows that the resonant frequency of the LC tank used is at 5 MHz (point m1 on the plot). The 20 MHz LTE signal is located at the right side of the S21 phase slope (point m2 on the plot). This indicates that the present embodiment is using the adjusted phase slope to compensate the previous stage phase distortion. This improvement can only be observed in a multi-stage amplifier. FIG. 9C shows only a slight change in impedance and reactance over that range of frequencies. To further verify the effect of the disclosed embodiment, an impedance simulation looking at three different nodes is shown in FIG. 10.

Figure 10:
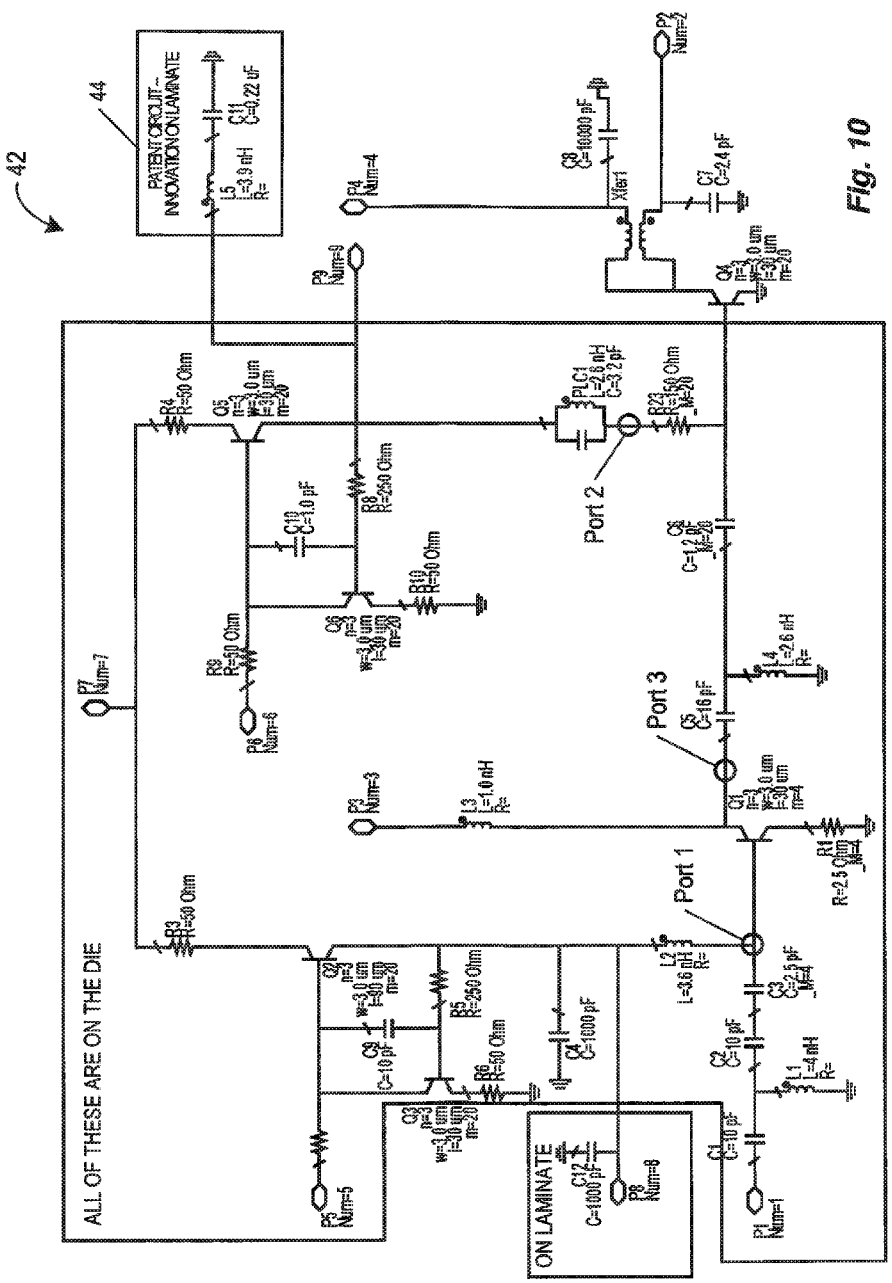
FIG. 10 is a schematic diagram of an exemplary multi-stage RF power amplifier with linearization circuit according to another embodiment of the subject matter described herein, used for an impedance simulation that interrogates three different ports in the circuit.

FIG. 10 is a schematic diagram of an exemplary multi-stage RF power amplifier 42 with linearization circuit 44 according to another embodiment of the subject matter described herein, used for an impedance simulation that interrogates three different nodes within the circuit 42. The nodes interrogated are labeled "Port 1," "Port 2," and "Port 3" in FIG. 10. The results of the simulation are shown in FIGS. 11A through 14.

Figure 11A:
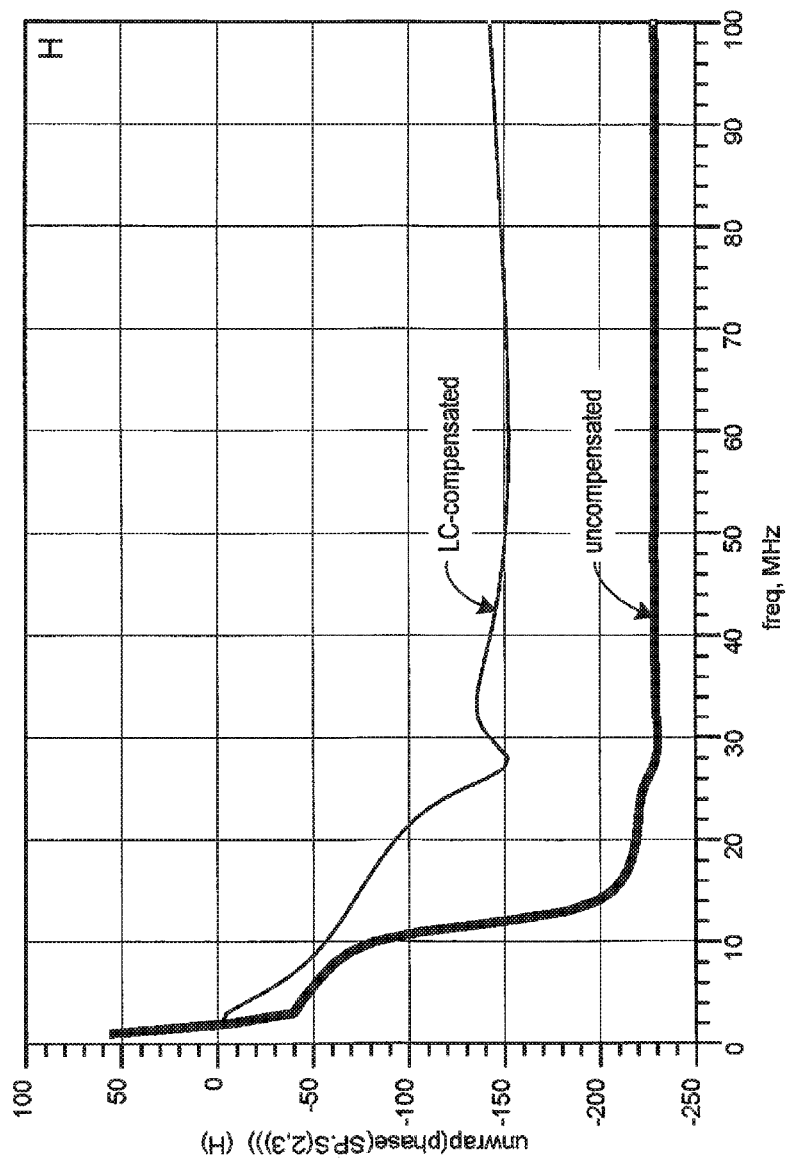
FIG. 11A is a graph of phase change versus frequency, showing the phase change between port 2 and port 3 of the circuit in FIG. 10 for an exemplary circuit according to an embodiment of the subject matter described herein (thin line) as compared to an uncompensated circuit (thick line).
Figure 11B:
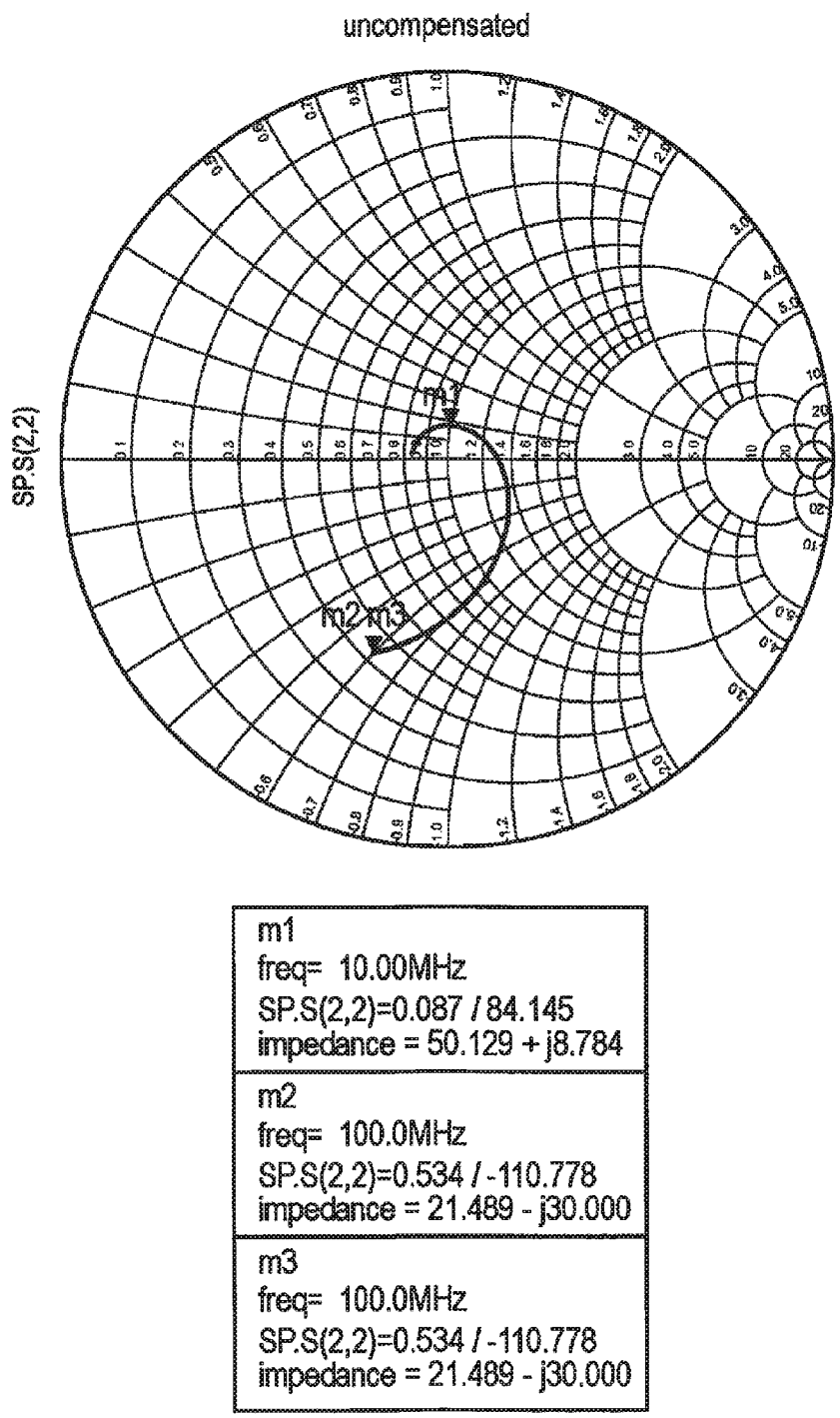
FIG. 11B is a Smith plot of the output impedance S(2,2) of an uncompensated circuit for a frequency from 10 MHz to 100 MHz.
Figure 11C:
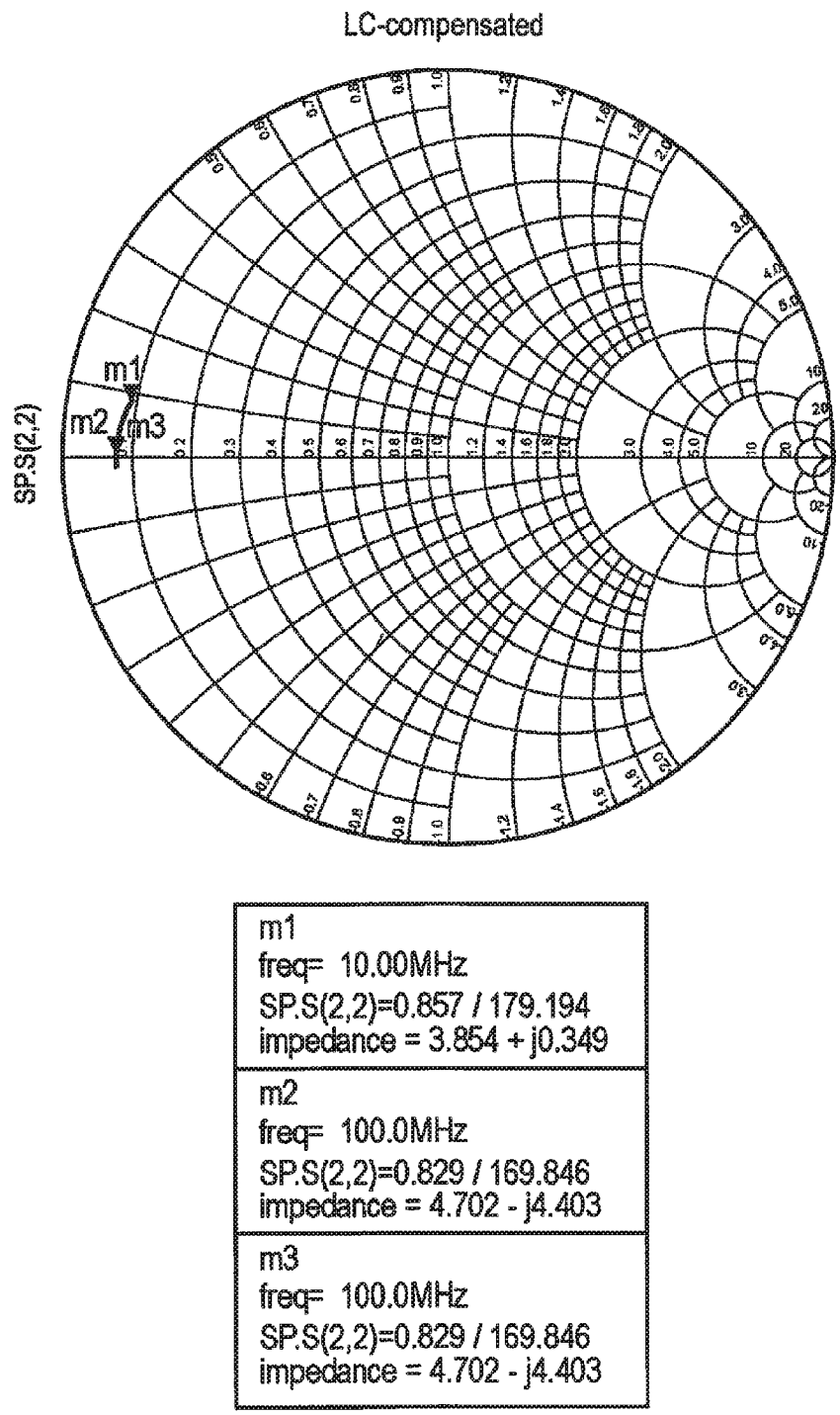
FIG. 11C is a Smith plot of the output impedance S(2,2) of the inductor-capacitor (LC)-compensated circuit in FIG. 10 for a frequency from 10 MHz to 100 MHz.

FIGS. 11A, 11B, and 11C show the results of a simulation of the amplifier 42 over a frequency range from 10 MHz to 100 MHz. FIG. 11A is a graph of phase change versus frequency, showing the phase change between port 2 and port 3 of the circuit in FIG. 10 (thin line) as compared to an uncompensated circuit (thick line) for the range of 0-100 MHz. FIG. 11A shows that the resonant circuit provides phase compensation within the video band.

FIG. 11B is a Smith plot of the output impedance S(2,2) of an uncompensated circuit, and FIG. 11C is a Smith plot of the output impedance S(2,2) of the LC-compensated circuit. FIG. 11A shows that the exemplary LC-compensated circuit has less phase distortion than does the uncompensated circuit. Moreover, the Smith plots of FIGS. 11B and 11C show that the uncompensated circuit in FIG. 11B has a significant change in impedance over the frequency range as compared to the change in impedance of the exemplary circuit over the same frequency range, as shown in FIG. 11C.

Figure 12A:
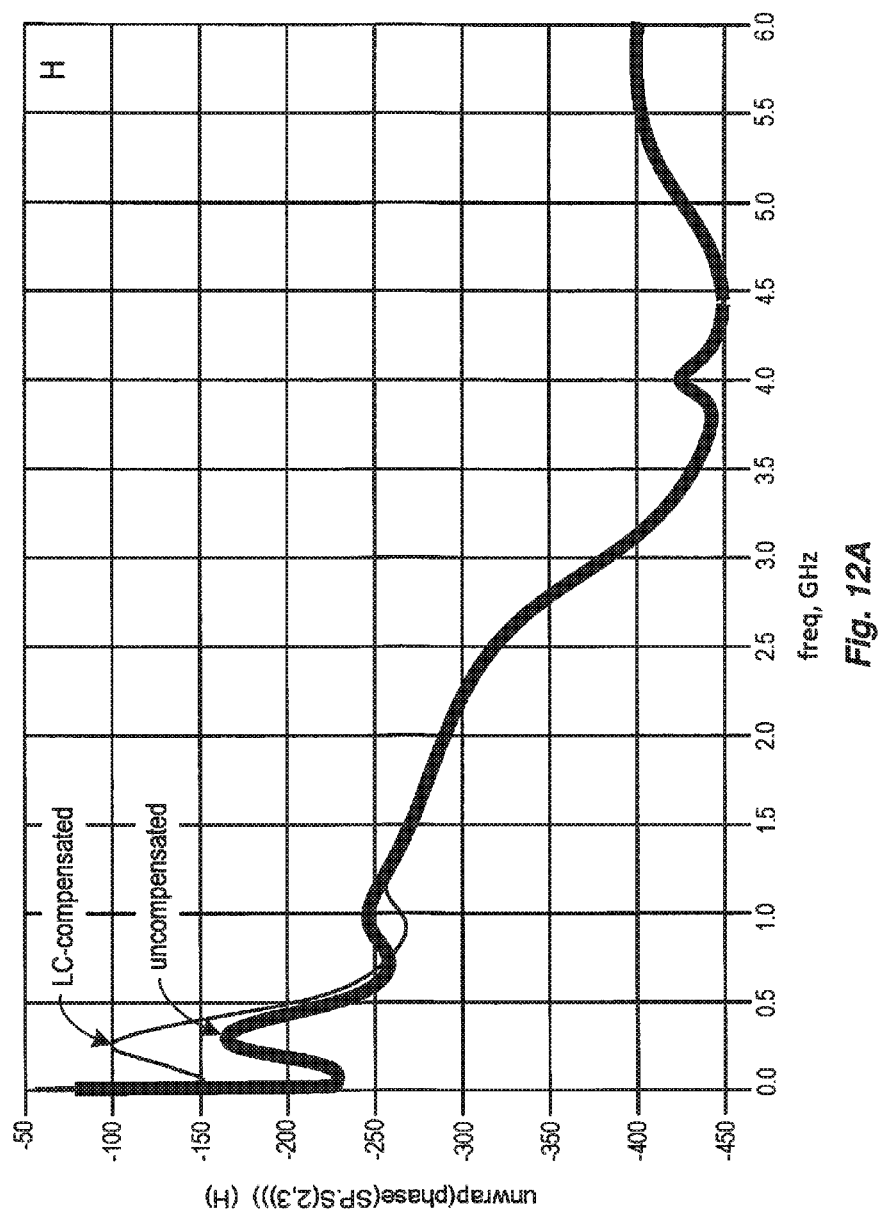
FIG. 12A is a graph of phase change versus frequency, showing the phase change between port 2 and port 3 of an uncompensated circuit (thick line) and the LC-compensated circuit in FIG. 10 (thin line) showing that the compensation provided by the LC circuit at the carrier frequency is negligible.
Figure 12B:
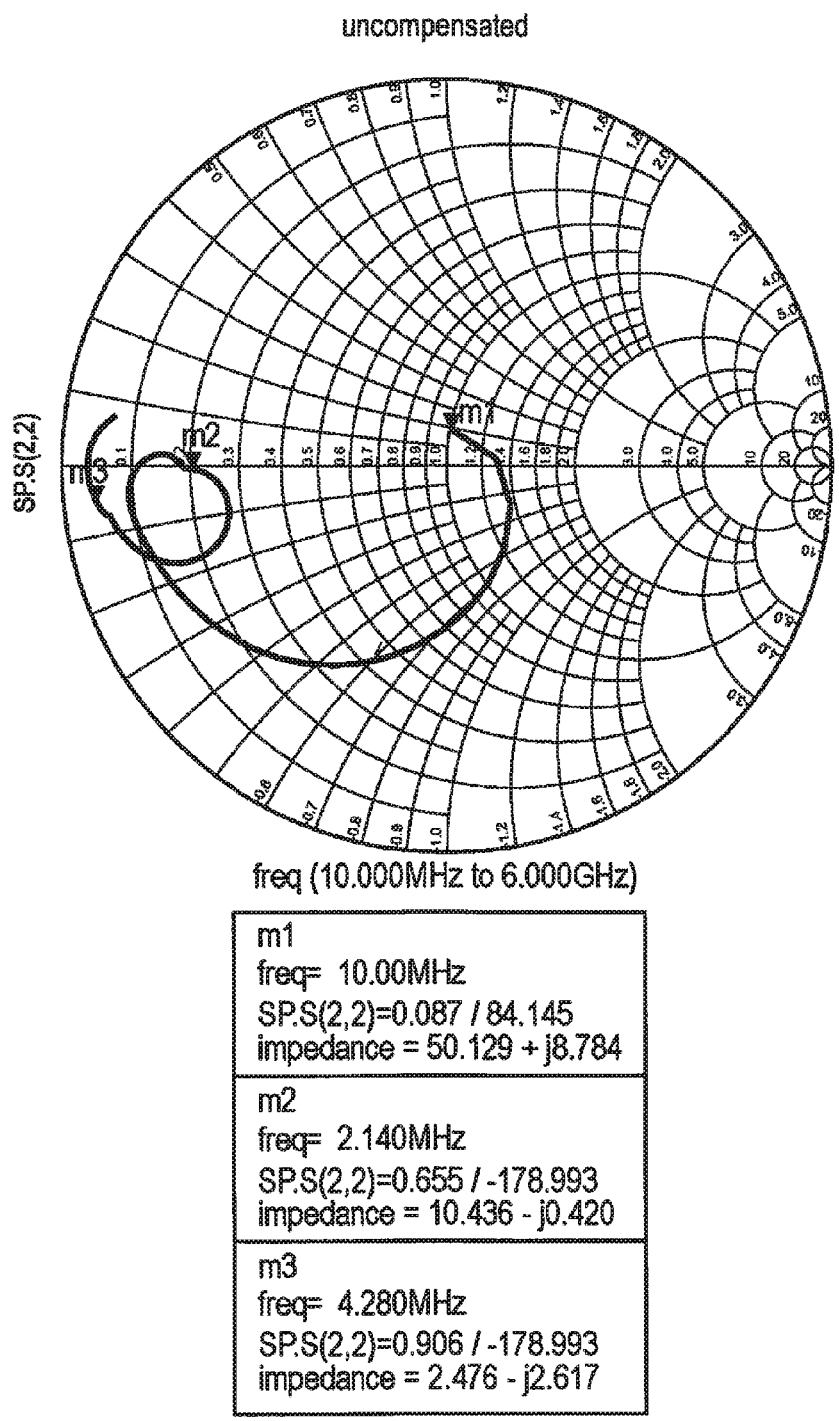
FIG. 12B is a Smith plot of the output impedance S(2,2) of an uncompensated circuit for a frequency from 10 MHz to 6 GHz.
Figure 12C:
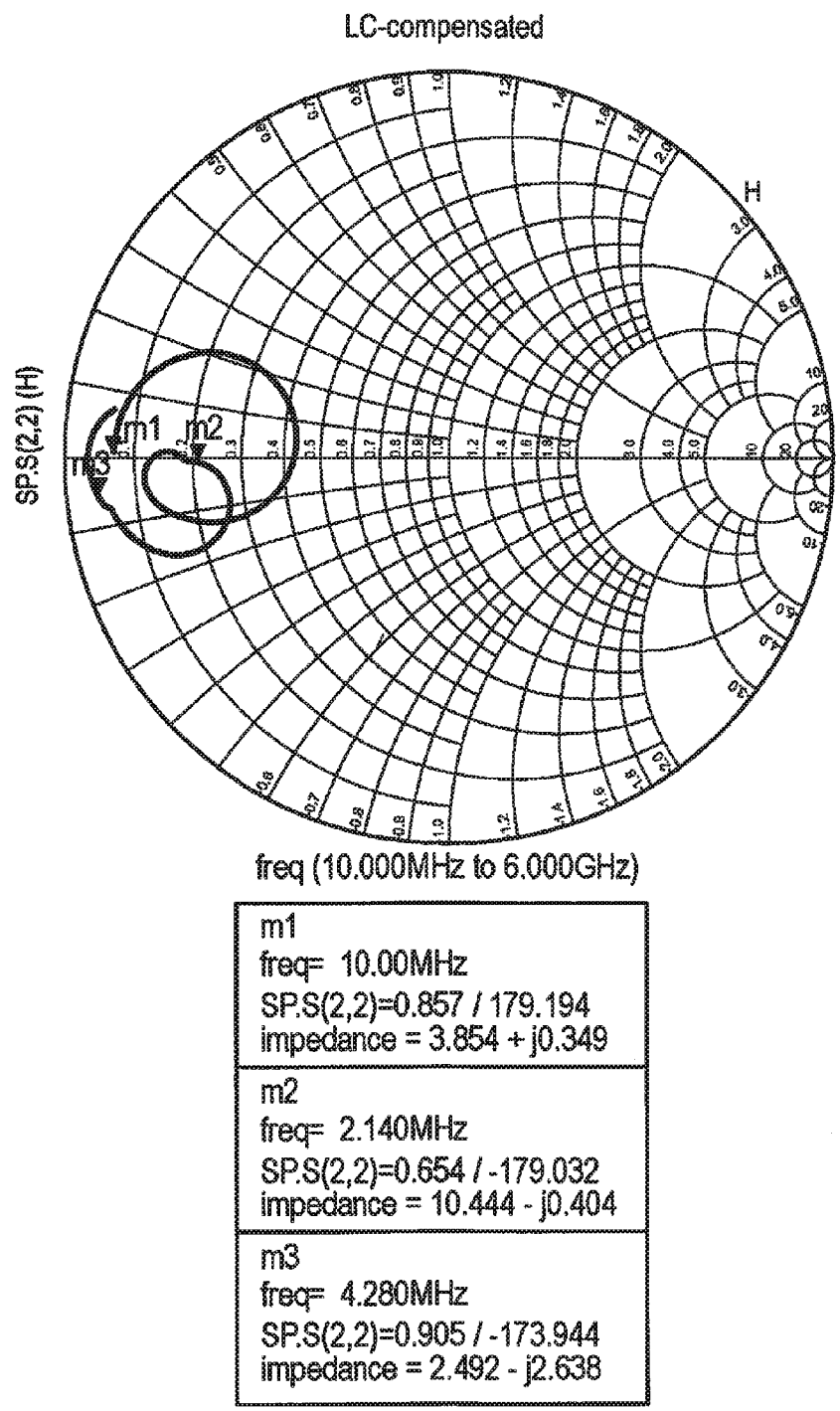
FIG. 12C is a Smith plot of the output impedance S(2,2) of the LC-compensated circuit in FIG. 10 for a frequency from 10 MHz to 6 GHz.

FIGS. 12A, 12B, and 12C show the results of a simulation over a frequency range from 1 MHz to 6 GHz to cover the interested cellular bands and their second harmonics. FIG. 12A is a graph of phase change versus frequency, showing the phase change between port 2 and port 3 of an uncompensated circuit (thick line) as compared to the LC-compensated circuit in FIG. 10 (thin line). FIG. 12A shows that the compensation provided by the LC circuit at the carrier frequency is negligible.

FIG. 12B is a Smith plot of the output impedance S(2,2) of an uncompensated circuit, and FIG. 12C is a Smith plot of the output impedance S(2,2) of the LC-compensated circuit. It can be seen that the variation of output impedance over frequency is greater for the uncompensated circuit (FIG. 12B) than for the LC-compensated circuit (FIG. 12C). FIGS. 12A to 12C indicate that the most important cancellation effect happens in the video band. More specifically, cancellation is not due to the second harmonic termination effect as in conventional circuits.

FIGS. 13A, 13B, 14A, and 14B are used to illustrate why a C-only circuit will have a smaller cancellation effect similar to the LC circuit of the subject matter described herein.

FIG. 13A includes a plot of phase versus frequency from 1 MHz to 1 GHz, comparing a conventional C-only compensated circuit (thin line) to the LC-compensated circuit in FIG. 10 (thick line).

FIG. 13B includes a Smith plot of output impedance S(2,2) for a frequency from 1 MHz to 1 GHz, comparing a conventional C-only compensated circuit (thin line) to the LC-compensated circuit in FIG. 10 (thick line).

Figure 14B:
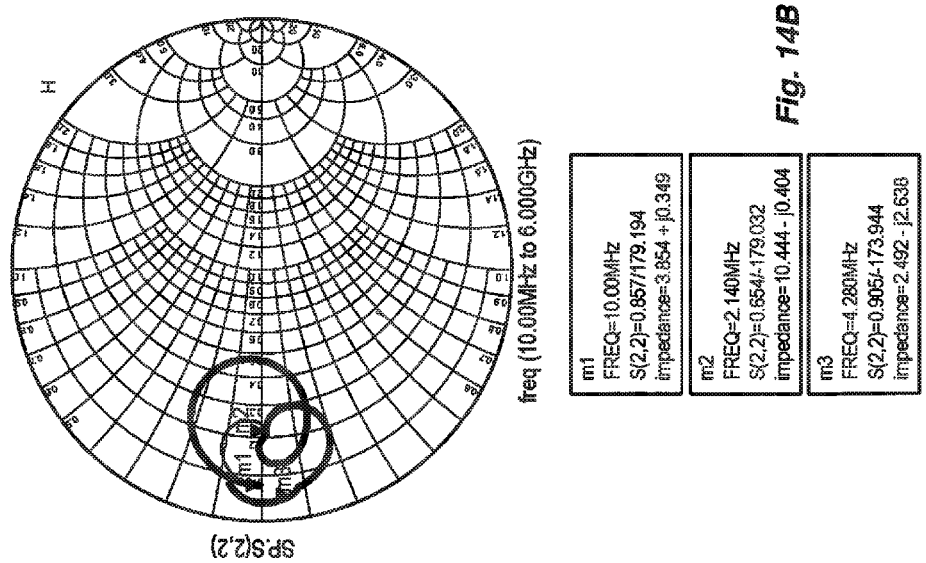
FIG. 14B is a Smith plot of output impedance S(2,2) for a frequency from 1 MHz to 6 GHz, comparing a conventional C-only compensated circuit (thin line) to the LC-compensated circuit in FIG. 10 (thick line).
Figure 14A:
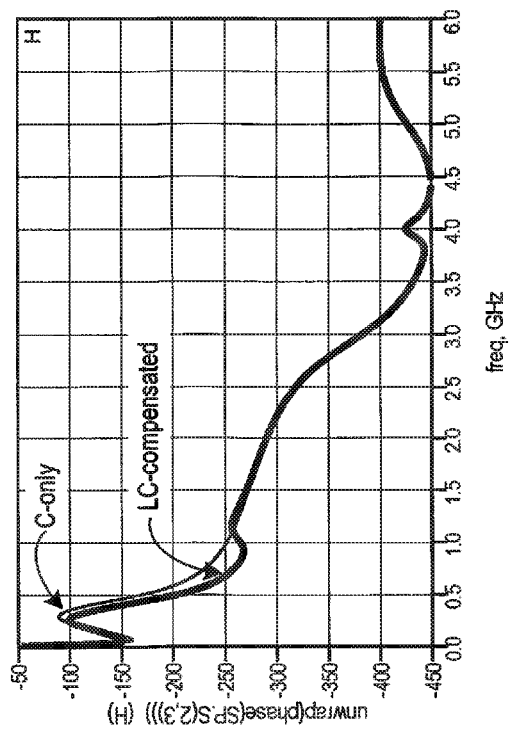
FIG. 14A is a plot of phase versus frequency from 1 MHz to 6 GHz, comparing a conventional C-only compensated circuit (thin line) to the LC-compensated circuit in FIG. 10 (thick line).

FIG. 14A includes a plot of phase versus frequency from 1 MHz to 6 GHz, comparing a conventional C-only compensated circuit (thin line) to the LC-compensated circuit in FIG. 10 (thick line).

FIG. 14B includes a Smith plot of output impedance S(2,2) for a frequency from 1 MHz to 6 GHz, comparing a conventional C-only compensated circuit (thin line) to the LC-compensated circuit in FIG. 10 (thick line).

It can be seen in FIGS. 13A, 13B, 14A, and 14B that the C-only compensated circuit has a tighter and smaller impedance change over frequency than the LC-compensated circuit of the subject matter described herein. However, as the ACLR data in FIG. 4 shows, the LC circuit has a much better linearity as compared to the C-only circuit. This indicates that the LC circuit re-shapes the first stage non-linear content and generates a cancellation effect on the second stage nonlinearity.

The following references, denoted by numerals throughout the text, are incorporated herein by reference in their entireties:

[1] Kim, Bumman, et al., "Advanced Design of Differential CMOS PA," Proceedings of the 2014 IEEE Topical Conference on Power Amplifiers for Wireless and Radio Applications (PAWR), Jan. 19-23, 2014, pp. 31-33.

[2] Jin, Sangsu, et al., "Control of IMD Asymmetry of CMOS Power Amplifier for Broadband Operation using Wideband Signal," IEEE Transactions on Microwave Theory and Techniques, Vol. 61, No. 10, October 2013, pp. 3753-3762.

[3] Kimura, Koichi, et al., "Improvement in ACLR Asymmetry for W-CDMA InGaP/GaAs HBT Power Amplifier," Proceedings of the 12th GAAS Symposium, Amsterdam, 2004, pp. 527-530.

[4] Takenaka, Isao, et al., "Improvement of Intermodulation Distortion Asymmetry Characteristics with Wideband Microwave Signals in High Power Amplifiers," IEEE Transactions on Microwave Theory and Techniques, Vol. 56, No. 6, June 2008, pp. 1355-1363.

[5] Park, Byungjoon, et al., "A 31.5%, 26 dBm LTE CMOS Power Amplifier with Harmonic Control," Proceedings of the 2012 7th European Microwave Integrated Circuits Conference (EuMIC), Oct. 29-30, 2012, pp. 341-344.

[6] McCallister, Ronald D., et al., "Transmitter Linearized using Look-up Table with Unadaptable Data and Method Therefore," U.S. Pat. No. 8,611,459 B2, issued Dec. 17, 2013.

[7] Cho, Yungsung, et al., "Low Idle Current LTE Power Amplifier with 2nd Harmonic Control," Proceedings of the 2012 7th European Microwave Integrated Circuits Conference (EuMIC), Oct. 29-30, 2012, pp. 337-340.

Those skilled in the art will recognize improvements and modifications to the preferred embodiments of the present disclosure. All such improvements and modifications are considered within the scope of the concepts disclosed herein and the claims that follow.

What is claimed is:

1. A multi-stage Radio Frequency (RF) power amplifier, comprising
   a first amplification stage configured to amplify an input signal to provide a first output signal having a phase distortion;
   a second amplification stage having an input and configured to amplify the first output signal that is received at the input to provide a second output signal, wherein the second output signal has a carrier frequency ($F_C$) modulated by a signal content (S) having a signal content bandwidth ($F_S$); and
   a resonant circuit comprising an inductor and a capacitor and having a resonant frequency ($F_R$), the resonant circuit coupled to the input of the second amplification stage and compensating for the phase distortion caused by the first amplification stage at frequencies within the signal content bandwidth $F_S$, wherein the resonant frequency $F_R$ is less than the signal content bandwidth $F_S$.

2. The amplifier of claim 1 wherein the carrier frequency $F_C$ is greater than 1.0 GHz.

3. The amplifier of claim 1 wherein the carrier frequency $F_C$ is in a range from 2.0 GHz to 2.2 GHz.

4. The amplifier of claim 1 wherein the signal content bandwidth $F_S$ is less than 50 MHz.

5. The amplifier of claim 1 wherein the signal content bandwidth $F_S$ is in a range from 18 MHz to 22 MHz.

6. The amplifier of claim 1 wherein the resonant frequency $F_R$ is less than 15 MHz.

7. The amplifier of claim 1 wherein the resonant frequency $F_R$ is in a range from 1 MHz to 10 MHz.

8. The amplifier of claim 1 wherein the resonant frequency $F_R$ is in a range from 2 MHz to 5 MHz.

9. The amplifier of claim 1 wherein the signal content bandwidth $F_S$ is less than 50 MHz and the resonant frequency $F_R$ is less than 10 MHz.

10. The amplifier of claim 1 wherein the signal content bandwidth $F_S$ is less than 25 MHz and the resonant frequency $F_R$ is less than 7 MHz.

11. The amplifier of claim 1 wherein the resonant frequency $F_R$ is in a range from ($F_S/4$) to ($F_S/2$).

12. The amplifier of claim 1 wherein the inductor and capacitor are configured as an LC tank network.

13. The amplifier of claim 12 wherein the inductor and capacitor are connected in series.

14. The amplifier of claim 12 wherein the inductor and capacitor are connected in parallel.

15. The amplifier of claim 1 wherein the inductor has a nominal inductance of 3.9 nanoHenries (nH) and wherein the capacitor has a nominal capacitance of 0.22 microFarads (μF).

* * * * *

UNITED STATES PATENT AND TRADEMARK OFFICE
CERTIFICATE OF CORRECTION

PATENT NO. : 9,929,702 B2
APPLICATION NO. : 15/265173
DATED : March 27, 2018
INVENTOR(S) : Wenlong Ma and Barry Jia-Fu Lin Page 1 of 1

It is certified that error appears in the above-identified patent and that said Letters Patent is hereby corrected as shown below:

In the Specification

In Column 6, Line 3, replace "signal content bandwidth F." with --signal content bandwidth $F_S$.--.

Signed and Sealed this
Fifteenth Day of May, 2018

Andrei Iancu
*Director of the United States Patent and Trademark Office*